(12) United States Patent
Kirk et al.

(10) Patent No.: US 7,602,628 B2
(45) Date of Patent: Oct. 13, 2009

(54) POWER PRODUCTION DURING A REDUCED ACTIVITY STATE

(75) Inventors: James W. Kirk, Westborough, MA (US); Mark R. Hickman, Westborough, MA (US)

(73) Assignee: Bose Corporation, Framingham, MA (US)

( * ) Notice: Subject to any disclaimer, the term of this patent is extended or adjusted under 35 U.S.C. 154(b) by 263 days.

(21) Appl. No.: 11/466,021

(22) Filed: Aug. 21, 2006

(65) Prior Publication Data

US 2008/0042711 A1 Feb. 21, 2008

(51) Int. Cl.
*H02M 7/00* (2006.01)

(52) U.S. Cl. .................................................. 363/123

(58) Field of Classification Search ................. 393/123, 393/131, 135; 307/64, 65, 66; 327/110, 327/291, 300, 304
See application file for complete search history.

(56) References Cited

U.S. PATENT DOCUMENTS

| | | | | |
|---|---|---|---|---|
| 4,326,287 A | * | 4/1982 | Abramson | 370/276 |
| 5,315,533 A | * | 5/1994 | Stich et al. | 700/298 |
| 6,008,681 A | * | 12/1999 | Beutler et al. | 327/304 |
| 2005/0135127 A1 | * | 6/2005 | Hamilton | 363/89 |

* cited by examiner

*Primary Examiner*—Adolf Berhane

(57) ABSTRACT

In addition to other aspects disclosed, a method comprises providing a signal to a transformer for supplying power during a reduced activity state. The signal comprises a series of pulses that comprises a positive pulse and a negative pulse. The signal is a segmented version of another signal provided to the transformer during the active state.

31 Claims, 5 Drawing Sheets

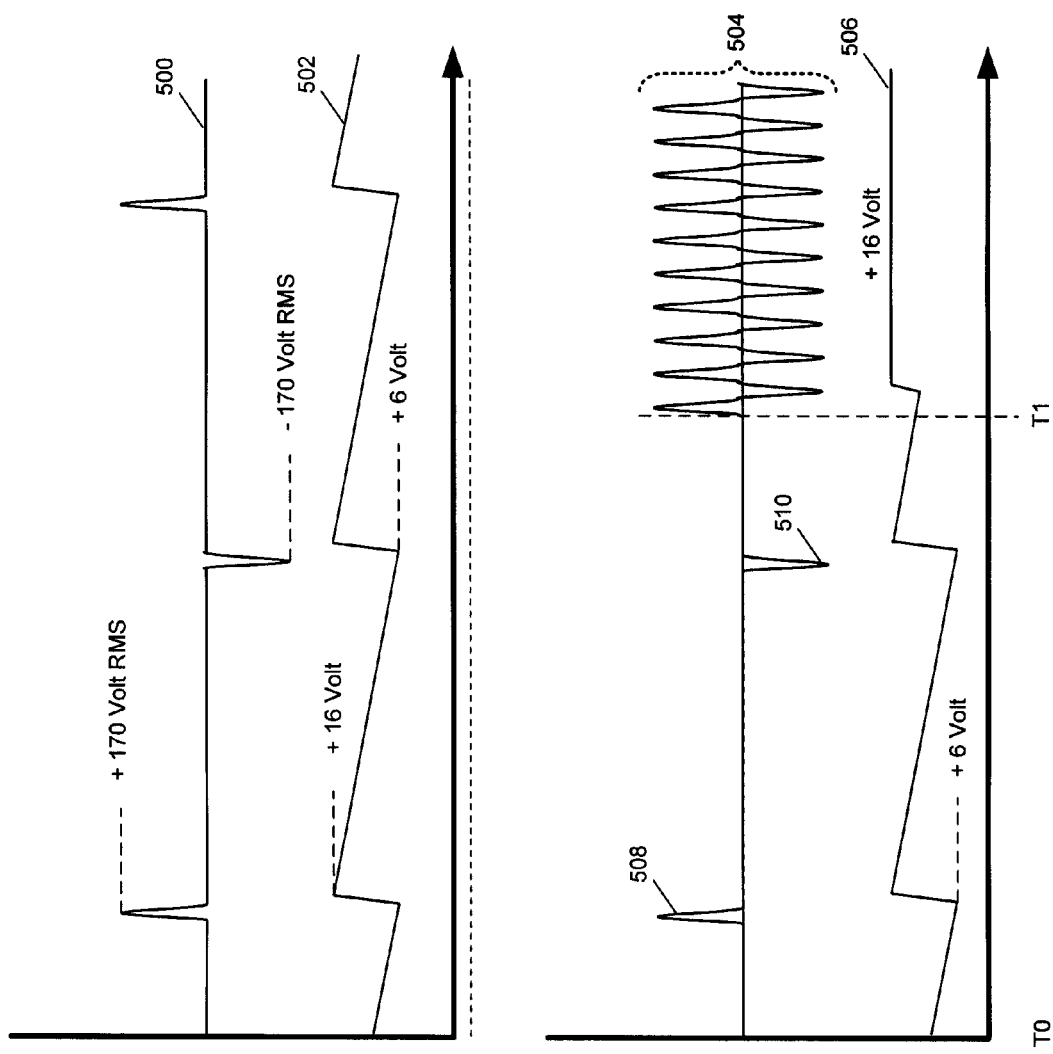

POWER PRODUCTION DURING A REDUCED ACTIVITY STATE

BACKGROUND

This disclosure relates to providing power during a reduced activity state.

By connecting a load to the secondary side of a transformer, power may be provided to the load from a power source connected to the primary side of the transformer. The transformer may increase (e.g., step-up) or decrease (e.g., step-down) the voltage present on the primary side depending upon the supply needs of the load. Along with the load, the transformer itself may dissipate power being provided to the secondary side of the transformer.

SUMMARY

In some aspects of the invention, a method is disclosed that comprises providing a signal to a transformer for supplying power during a reduced activity state. The signal includes a series of pulses that includes a positive pulse and a negative pulse. The signal is a segmented version of another signal provided to the transformer during an active state. The width of the positive and negative pulses may be adjustable. The series of pulses may include one or more pulse patterns such as the positive pulse being provided prior to the negative pulse, alternating positive pulses and negative pulses, alternating pairs of positive and negative pulses, etc. A predefined time delay may be introduced between the positive pulse and the negative pulse. A trigger may initiate a transition from the inactive state to the active state or a transition from the active state to the inactive state. The second signal may include an alternating current (AC) voltage signal. The series of pulses may include a series of half cycle pulses such as a series of half cycles of an AC voltage signal.

In some aspects of the invention, an apparatus is disclosed that comprises a driver circuit to provide a signal to a transformer for supplying power during a reduced activity state. The signal includes a series of pulses that includes a positive pulse and a negative pulse. The signal is a segmented version of another signal provided to the transformer during an active state. The series of pulses may include one or more pulse patterns such as the positive pulse is provided prior to the negative pulse, alternating positive pulses and negative pulses, alternating pairs of positive and negative pulses, etc. A time delay may separate the positive pulse and the negative pulse. A counter may define the time delay, for example, based upon counting an odd number of half cycles. The apparatus may include an audio equipment device. The driver circuit may receive a trigger signal to initiate a transition from the reduced-activity state to the active state. The signal provided during the active state may include an AC voltage signal. The driver circuit may include one or more bidirectional semiconductor devices such as a triac. The series of pulses may include a series of half cycle pulses such as a series of half cycles of an AC voltage signal.

In some aspects of the invention, a system is disclosed that comprises a transformer to provide power to a load. The system also includes a driver circuit to provide a signal to the transformer for supplying power during a reduced activity state. The signal includes a series of pulses that includes a positive pulse and a negative pulse. The signal is a segmented version of another signal provided to the transformer during an active state. The system may also include a standby circuit to initiate a transition from the reduced-activity state to the active state. The load may include an audio equipment device. The signal provided to the transformer during the active state may be a signal that includes an AC voltage signal. A trigger signal received by the standby circuit may initiate the transition from the reduced-activity state to the active state. The transformer may provide power to the load during the active state. The series of pulses may include one or more pulse patterns such as the positive pulse is provided prior to the negative pulse, alternating positive pulses and negative pulses, alternating pairs of positive and negative pulses, etc. Various types of transformers may be implemented such as an iron core transformer.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 5 is a diagram of waveforms for providing power during a reduced activity state and an active state.

Like reference symbols in the various drawings indicate like elements.

DETAILED DESCRIPTION

Figure 1:
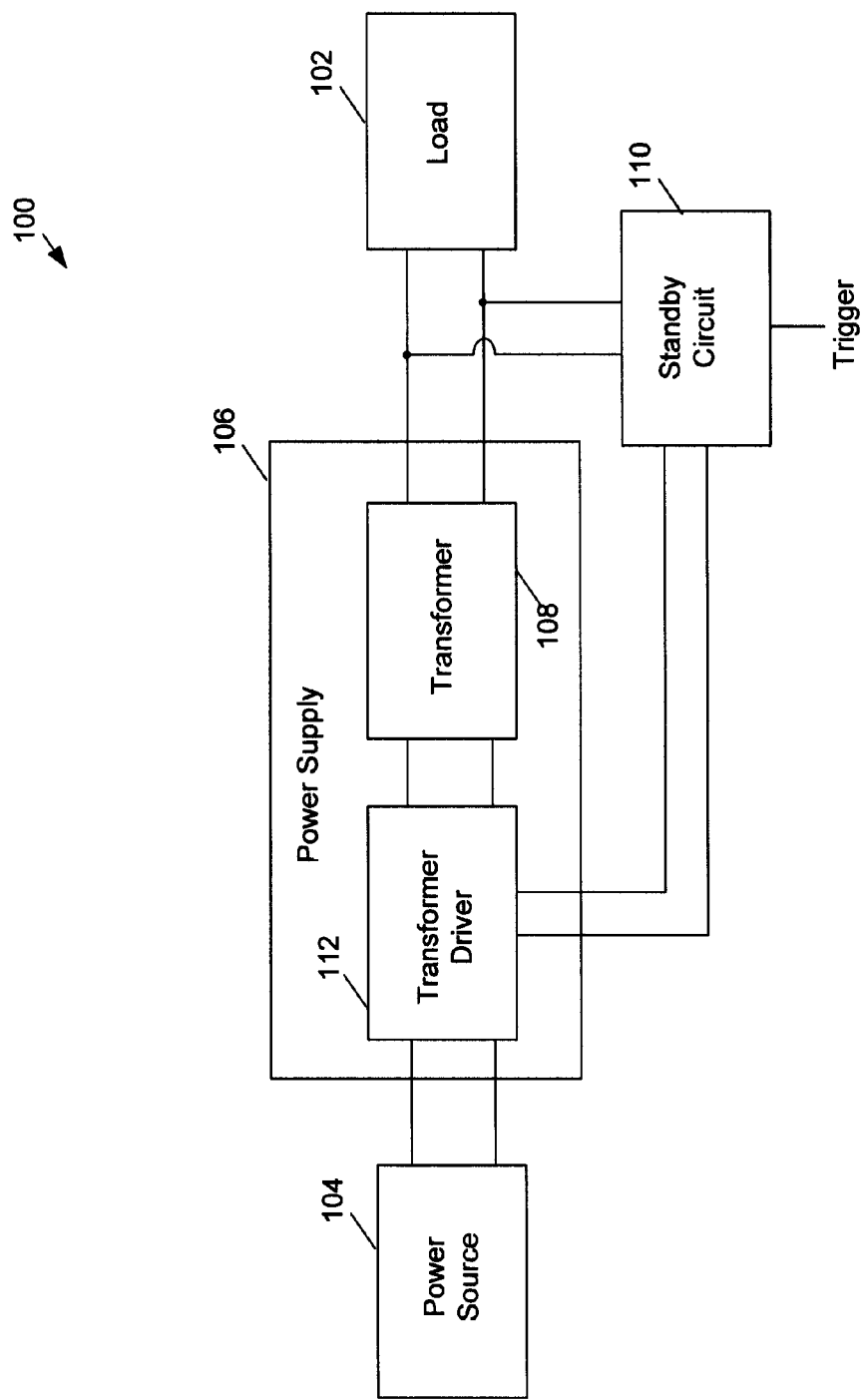
FIG. 1 is a diagram of a system that includes power supply, a load and a standby circuit.

Referring to FIG. 1, a system 100 provides power to a load 102 from a power source 104 such as a wall outlet, a generator, or other type of source that provides a voltage signal that is consistent with a regional power standard (e.g., 120 alternating current (AC) volts 60 Hertz in the United States, 230 volts AC 50 Hertz in the United Kingdom, etc.). To provide power to the load 102, a power supply 106 conditions the voltage signal from the power source 104 prior to delivery to the load. In this example, power supply 106 includes a transformer 108 that may increase or decrease (e.g., step-up, step-down) the voltage signal dependent upon the power needs of the load 102. Power supply 106 may also perform one or more operations such as rectification, filtering, isolation, etc.

While operating, the load 102 typically draws more current from the power supply 106 than during periods of inactivity. For example, if the load 102 includes a powered speaker, a tuner, a compact disc (CD) player and an amplifier, or other type of audio equipment device, a significant amount of current may be drawn from the power supply 106 during operation of the equipment. Alternatively, when not in operation (e.g., in an inactive state), less current may be drawn by the load 102.

To initiate power delivery to the load 102, a standby circuit 110 sends a signal to a transformer driver 112 (included in the power supply 106) to commence the delivery of a voltage signal from the power source 104 to the transformer 108. To initiate signal transmission to the transformer driver 112, the standby circuit 110 may receive a trigger signal from an external source. For example, a user may press a button to power on the load 102 and, thereby, send a trigger signal to the standby circuit 110 that correspondingly sends a signal to the transformer driver 112. Upon receiving the signal, the transformer driver 112 directs a voltage signal from the power source 104 to the primary side of the transformer 108. Alternatively, a trigger signal may be generated by a sensor or a watchdog circuit configured to send a trigger signal when a certain condition is met. For example, a sensor circuit may sense audio input signal lines. If the device is in an inactive state, the sensor circuit produces a trigger signal upon sensing the presence of an audio signal on the input lines.

Along with providing power from the power source 104, the transformer driver 112 may halt power delivery to the transformer 108. For example, if the button is depressed (or pressed a second time), the standby circuit 110 may signal the transformer driver 112 to halt power delivery to the transformer 108. However, even though the load 102 may not be operating, portions of the system 100 may still need to be powered during period of load inactivity. For example, in preparation of receiving a trigger signal, the standby circuit 110 may continuously need power. In some conventional systems, a second transformer may be implemented to provide power to the standby circuit.

However, along with needing additional circuit board space, additional costs may be incurred. In this exemplary design, standby circuit 110 is provided power from transformer 108, which also provides power to the load 102. By providing power to the standby circuit 110, a secondary transformer or separate power supply is not needed for the standby circuit, thereby conserving circuit board real estate and cost.

In general, the power needed by the standby circuit 110 is significantly less than the power needed by the load 102 during an active state. The transformer 108 itself along with the standby circuit 110 may dissipate power while the load 102 is inactive. For example, certain types of transformers may draw current even if no load is present on the secondary side of the transformer. Iron core transformers may draw current levels such that power dissipation may range, e.g., from four to six watts when a load is absent. Thus, along with driving the transformer 108 to provide power to the standby circuit 110 for continuous operation, the power needs to be provided in a manner to reduce power loss through the transformer. Thus, the transformer driver 112 may direct the transformer 108 to produce less power when the 102 is inactive and relatively more power when the standby circuit 110 has been trigger to place the load in an active state.

To provide appropriate power levels when the load is inactive, the transformer driver 112 provides a series of pulses to the primary side of the transformer 108. By providing the pulses, power is provided to the standby circuit 110 such that it continuously operates and is ready to receive trigger signals. Additionally, by providing pulses to the transformer 108, power dissipation by the iron core of the transformer 108 is reduced, thereby conserving power while providing power to the standby circuit 110 for operation while the load 102 is inactive.

Figure 2:
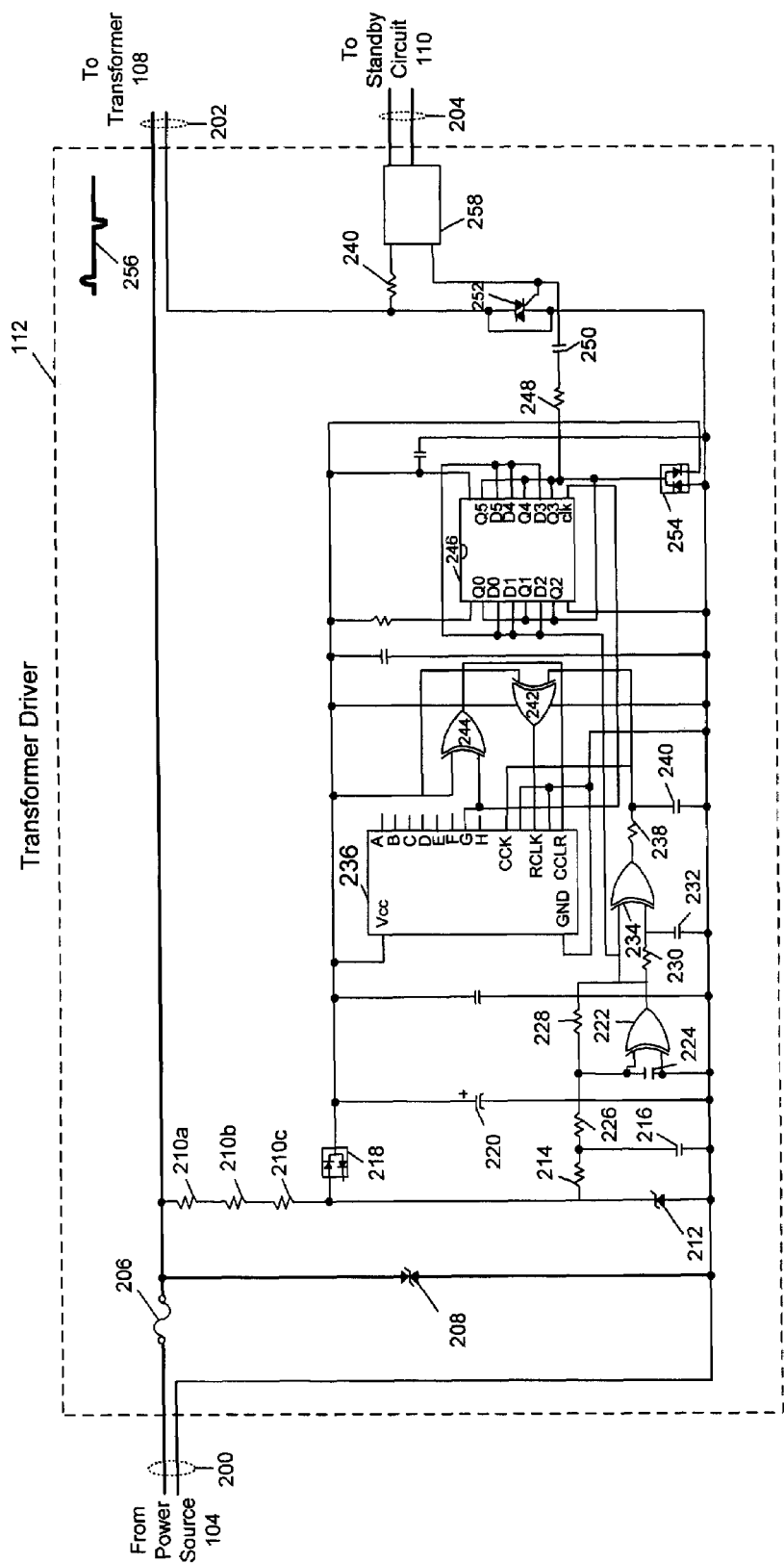
FIG. 2 is a schematic diagram of a transformer driver circuit.

Referring to FIG. 2, an exemplary transformer driver 112 receives on a pair of conductors 200 a voltage signal (e.g., 120 volts AC) that is used to produce a series of pulses that are provided to the transformer 108 on a conductor pair 202. To produce the pulses, the transformer driver 112 may selectively gate half cycle portions of the voltage signal provided by the power source 104. For example, a pulse series may include alternating positive and negative half cycles of the voltage signal from power source 104. To initiate the production of the pulse series, another pair of conductors 204 receives, e.g., trigger signals from the standby circuit 110.

If a trigger signal has not been received and the load 102 is inactive, the transformer driver 112 provides a series of pulses on the conductor pair 202 so that the transformer 108 continuously powers the standby circuit 110. For example, a series of pulses may include a number of half cycles of an AC voltage signal provided by the power source 104. The half cycle pulses may alternate in polarity so that the transformer may not become biased for one polarity. One or more time delays may be introduced between the half cycle pulses since less power is typically needed for the standby circuit 110 to operate (compared to the combined operating of the load 102 and the standby circuit 110). By adding time delays between the pulses, power is conserved while still providing voltage to the transformer 108 to supply power to the standby circuit 110. Alternatively, if the load 102 is in an active state (e.g., operating), the entire voltage signal (e.g., 120 volt AC signal) from the power source 104 may be provided on the conductor pair 202 to the primary side of the transformer 108. Although, in some arrangements the voltage signal may be processed (e.g., filtered, etc.) prior to being provided to the transformer 108. Along with providing power to the load 102, the transformer uses the voltage signal to provide power for operation of the standby circuit 110.

As described below, the transformer driver 112 includes timing circuitry such that portions (e.g., half cycle pulses) of the power source 104 voltage signal are provided to the transformer 108 so that the standby circuit 110 is provided power to compile with one or more national or international energy programs (e.g., the Energy Star program, California Energy Commission (CEC) 400-2005-012 standard, etc.). For example, the timing circuitry may segment the voltage signal from the voltage source 104 to provide a series of half cycle pulses to the transformer 108. Furthermore, the transformer driver 112 may adjust parameters (e.g., pulse width, etc.) of the pulses provided to the transformer 108. By implementing timing circuitry, cost is reduced along with circuit board real estate compared to using a second transformer to provide power to the standby circuit 110 when the load 102 is inactive. Additionally, by providing a series of pulse to the transformer 108, magnetic biasing of the transformer may be reduced. For example, by alternating the polarity of the pulses, the transformer 108 may not be biased for one polarity, which may reduce transformer impedance and increase power drain.

Power source 104 connects to transformer driver 112 via a fuse 206 to protect against one or more operational faults (e.g., a short circuit) that may occur. Additionally, transformer driver 112 may include a varistor 208 that protects the driver from voltage and current transients that may be present in power source signals. In some arrangements, a varistor may not be implemented.

The voltage signal from the power source 104 is provided to three resistors 210a, 210b, 210c that may have equivalent resistances (e.g., 68.1 K-Ohm) or different resistance values. Various types of resistors may be used to implement the resistors 210a-c, for example, the resistors may be surface mounted with packages approximately 0.12 inches in length and 0.06 inches in width (e.g., a 1206 two terminal package). Along with resistor size dimensions, resistor spacing may be selected to comply with one or more industry standards. For example, each resistor layout may provide approximately 1.8 mm of spacing, thus, two resistors may have a combined spacing of 3.6 mm and thereby may meet an Underwriters Laboratory (UL) requirement for providing at least 3 mm of clearance between components that may experience phases of a power supply signal. Also, by using three resistors, the safety margin is increased for scenarios such as if one of the resistors 210a-c experiences a short circuit.

Transformer driver 112 also includes a Zener diode 212 that produces an approximate square wave by limiting the voltage of the power source signal to a relatively small positive value (e.g., +five volts) and small negative value (e.g., −0.7 volt). Typically the positive value of the square wave is less than a nominal Zener voltage due to loading and low bias currents. The square wave produced by the Zener diode 212 is provided to a resistor 214 and a capacitor 216 connected as a low pass filter to remove noise components on the power source 104 signal and to incorporate a time delay into the waveform. For example, a time delay of 1.5 milli-seconds may be introduced into the square wave. The square wave is also half wave rectified by a diode 218 and is filtered by a capacitor 220.

A logical exclusive OR (XOR) gate 222 has a capacitor 224 connected to both gate inputs to provide a comparator operation upon the square wave provided by the low pass filter (i.e., resistor 214 and capacitor 216) via a resistor 226. By connecting a feedback resistor 228 between the output of the XOR gate 222 and one of its gate inputs, a Schmitt trigger is formed that provides hysteresis (e.g., exceed two thresholds to indicate a state change) for filtering the square wave. The XOR gate 222 may be implemented by various types of gates such as a 74VHC86 XOR gate, produced by ST Microelectronics of Geneva, Switzerland, which are CMOS based and exhibit low power, high speed, and are tolerant of input voltages that exceed the supply voltage values. Resistors (e.g., a resistor 226) connected to the inputs or the output of the XOR gate 222 also assist in tolerating excessive input voltage values.

The resistor 230 and a capacitor 232 connect to form a low pass filter that introduces another time delay (e.g., 1.5 millisecond) into the waveform. Thus, a square wave output from XOR gate 222 (e.g., that is time delayed by 1.5 milli-second due to resistor 214 and capacitor 216) is provided to one input of an XOR gate 234 and a delayed version of the square wave (provided by the resistor 230 and the capacitor 232) is provided to the other input of the XOR gate 234. Due to the time delay between the input signals, XOR gate 234 outputs a pulse for each transition (e.g., logic low to logic high or logic high to logic low) of the square wave output by XOR gate 222. Thus a pulse is produced for each half cycle (e.g., positive half cycle, negative half cycle) of the sinusoidal voltage signal provided by the power source 104.

To control the periodicity of the pulses produced by the transformer driver 112, the pulses output by XOR gate 234 are used as a clock signal for a counter 236 (after being filtered by a resistor 238 and a capacitor 240 pair connected as a low pass filter). In one implementation, the counter 236 is an eight-bit counter such as an 74HC590 made by Phillips Electronics of the Netherlands. By providing a clock signal (to the CLK port of the counter 236), the pulses control the incrementing of the counter.

An XOR gate 242 is connected as an inverter such that the output of the XOR gate 234 signals the count data to be stored in a register included in the counter 236. In this implementation the counting and register storing may be rising edge triggered (such that counting and register updating alternate), however other triggering techniques (e.g., falling edge triggering) may be implemented.

A logic one is output from the counter 236 to indicate that a particular number of voltage signal half cycles from the power source 104 have been counted. For example, after a particular number of cycles are counted, the output "G" of the counter 236 outputs a logic one that is provided to an input to an XOR gate 244. Similar to XOR gate 242, XOR gate 244 is connected as an inverter, however, the gate 244 is used to clear the counter. Once cleared the counter may resume counting until the "G" output again outputs a logic one to indicate a particular number of half cycles have been counted, and then clears to count again.

The "G" output is a binary output that corresponds to a decimal $2^6$ (i.e., 64). Each time the count reaches decimal 64, a logic one is output from the "G" output. In this implementation, the "G" output is also used to drive the clock of a flip-flop unit 246. The flip-flop unit 246 may be, for example, an 74HC174 hex D flip flop package made by Phillips Electronics that includes six positive-edge triggered flip-flops. Each of six data input ports (D0-D5) are provided data from the output of XOR gate 222. Since the clock of the flip-flop unit 246 is provided by the "G" output of the counter 236, a clock pulse appears at the counter every $2^6$ pulses. Additionally, an output is provided by each of the six output ports (Q0-Q5) of the flip-flop unit 246 based on the clock pulse.

For this design a square wave is provided by the flip-flop unit 246 that changes states every $2^n+1$ half cycles of the voltage signal from the power source 104. In this implementation, by using the "G" output of the counter 236 the square wave changes states every $2^6+1=65$ half cycles. However, in other implementations, the number of half cycles between states changes may be more or less than 65 half cycles, and may or may not conform to the $2^n+1$ half cycle constraint. For example, the clock of the flip-flop unit 246 may be connected to the "H" output (e.g., $2^7$ output) or the "F" output (e.g., $2^5$ output) of the counter 236, thereby providing a square wave from the six flip-flop unit 246 that changes states every 129 or 33 half cycles of the voltage signal from as the power source 104.

By counting $2^n+1$ half cycles, an odd number of half cycles is counted (e.g., 33, 65, 129) prior to the output from the flip-flop unit 246 changing state. Due to the odd numbered count, the output of the flip-flop unit 246 (e.g., the six parallel connected flip-flops outputs) provides a series of pulses that correspond to half cycles of the power source voltage signal with alternating polarities (e.g., negative half cycle, positive half cycle, negative half cycle, etc.).

By connecting each of the six output ports (Q0-Q5) of the flip-flop unit 246 in parallel, sufficient drive current may be provided with the produced pulse series for a resistor 248 with a resistance of 33 Ohms, for example. A capacitor 250 is connected in series with the resistor 248 to provide AC coupling for the series of pulses with alternating polarity. The resistor 248 and the capacitor 250 are typically selected to produce a time constant so that triggering based on the pulses does not extend into the following half cycle. Thus, the selected half cycles are provided to the transformer 108 and two consecutive half-cycles (e.g., a positive half cycle directly followed by a selected negative half cycle) are not provided to the transformer.

As mentioned above, during reduced activity periods transformer driver 112 provides a series of alternating polarity half cycles to the transformer 108. Accordingly, a semiconductor device that bi-directionally conducts is incorporated into the transformer driver 112. In this implementation a triac 252 is connected between the capacitor 250 and the one of the conductors in the conductor pair 202. Other types of bidirectional semiconductor devices such as a thyristor, two silicon-controlled rectifiers (SCRs) configured in an inverse parallel arrangement, or other similar semiconductor devices may be implemented individually or in conjunction with the triac 252. Combinations of two or more transistors (e.g., bipolar junction transistors, field effect transistors, etc.) may also be implemented to provide a bidirectional semiconductor device.

The triac 252 is a three-quadrant triac and operates in two or the quadrants based on the polarities of the pulses provided by the AC coupling of the capacitor 250. In particular, the triac 252 operates in the first quadrant (e.g., positive voltage present on main terminal one of the triac and a positive gate current) and the third quadrant (negative voltage present on main terminal one and a negative gate current). While in the first or third quadrant, the triac 252 provides a corresponding half cycle (e.g., positive half cycle or negative half cycle) present on the power source voltage signal to the transformer 108 via conductor pair 202. When the triac 252 is not operating in either of the two quadrants, no signal is provided to the transformer 108. A pair of diodes 254 are connected in parallel with the output ports of the flip-flop unit 246 to provide protection for voltage transients present on the power source 104 voltage signal that may be provided to the XOR circuitry (e.g., XOR 242) via the triac 252.

To assure that one half cycle is provided, a relatively narrow trigger pulse is provided to the triac 252. Additionally, by delaying the trigger pulse, the provided half cycle begins slightly past the zero-crossing point so that an appropriate gate current may be provided to the triac 252. This time delay is provided by the two approximately 1.5 milli-second time delays introduced by the low pass filters (e.g., resistor 230, capacitor 232). By introducing the approximately 3.0 millisecond time delay along with a relatively narrow trigger pulse, the triac 252 is triggered to operate during one half cycle. In some implementations, a positive current pulse is provided to the gate of the triac 252 to trigger delivery of a positive half cycle to the transformer 108 and a negative pulse is provided to the gate to trigger delivery of a negative half cycle. A waveform 256 illustrates a positive half cycle and a negative half cycle that are produced for delivery to the transformer 108.

The pulse repetition frequency of the half cycles may be selected based upon one or more parameters such as efficiency. For example, for a 60 Hertz power source voltage signal and a count of 65 (i.e., $2^6+1$), alternating half cycles may be provided approximately every 0.54 seconds. Provided such a series of half cycles with alternating polarity, the transformer 108 may provide sufficient voltage from its secondary side to operate the standby circuit 110 during periods of inactivity while significantly reducing the power consumption. Some operations of the standby circuit 110 may include receiving and decoding trigger signals from a remote control, a button, or other type of user interface device.

Upon receiving a signal to provide power to the load 102, standby circuit 110 sends a signal to the transformer driver 112 to change from a standby state to an active state such that the load 102 may be provided appropriate operating power. For example, when placed in an active state, the transformer 108 may provide the load 102 (e.g., a powered speaker, a CD-player, amplifier, etc.) with power for performing typical operations (e.g., retrieving audio content from a CD, amplifying the content, playing the content over the powered speaker).

In this implementation, an opto-coupler 258 is configured to receive a signal from the standby circuit 110 via the conductor pair 204. For example, a signal may be provided to the opto-coupler 258 that requests that the power supply 106 provide operating power to the load 102. Alternatively, a signal may be provided to the opto-coupler that represents that the load 102 is to be powered down and only the standby circuit 110 is to receive power.

Using light emissions for a trigger, the opto-coupler 258 also provides electrical isolation between the standby circuit 110 and the transformer driver 112. Thus, the opto-coupler 258 provides a safety layer while allowing signals to be sent from the secondary side of the transformer 108 to the primary side of the transformer. While the opto-coupler 258 is incorporated to pass signals while providing a level of safety, other light sensitive devices such as opto-isolators and photodiodes may also be implemented individually or in combination.

When the opto-coupler 258 receives a signal from the standby circuit 110, a signal is provided to the triac 252 for continuous operation. Once the triac 252 is biased by the opto-coupler signal, the voltage signal from the power source 104 is provided on the conductor pair 202 to the primary side of the transformer 108. In this implementation, the sinusoidal voltage signal is stepped-down by the transformer 108 and then rectified to produce a direct current (DC) voltage signal. However, in other implementations, the transformer 108 may step-up the voltage signal being provided to the primary winding.

Similar to triggering the transformer driver 112 to place the power supply 106 in an active state, the standby circuit 110 may also trigger the transformer driver 112 to return the power supply to a reduced activity state. In such a scenario, the opto-coupler 258 may send a signal to the triac 252 such that the triac does not continuously operate. Triggering control of the triac 252 is returned to the counter and flip-flop circuitry included in the transformer driver 112.

Figure 3:
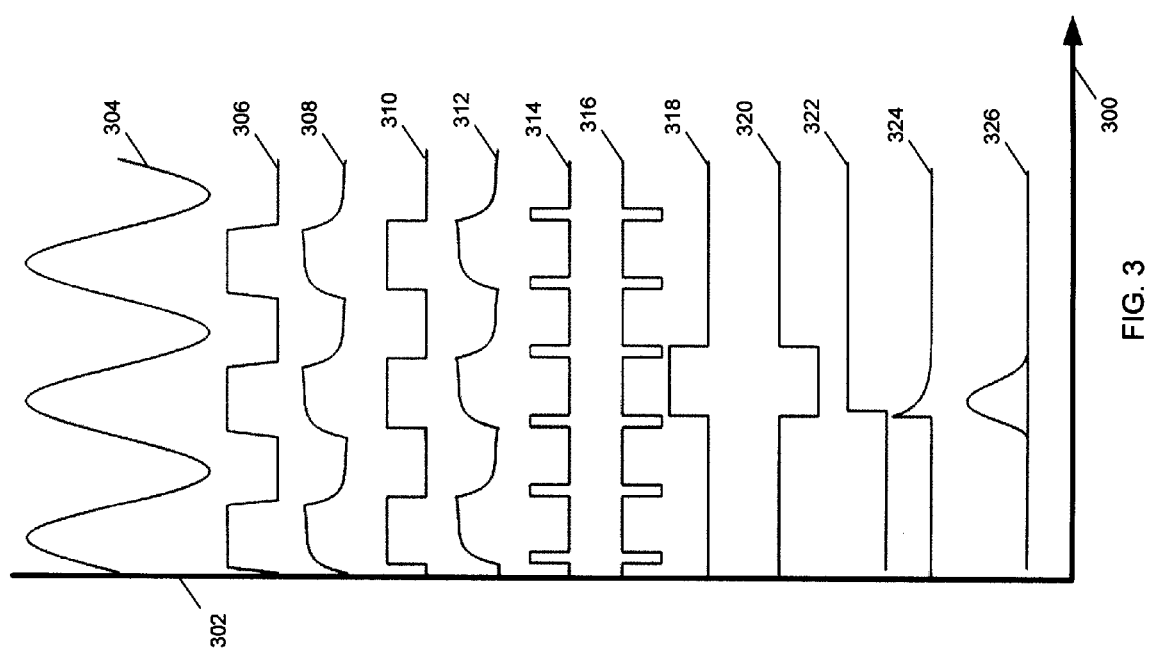
FIG. 3 is a diagram of waveforms for producing a positive half cycle pulse.

Referring to FIG. 3, a series of waveforms that represent signals present at particular locations in the transformer driver 112 is shown. Each waveform is represented as a function of time by a horizontal axis 300. Voltage is represented by a vertical axis 302 and each waveform is offset for ease of visual comparison.

Waveform 304 represents a typical sinusoidal voltage signal (e.g., 60 Hertz 120 Volts AC) that is provided by the power source 104 to the transformer driver 112. The Zener diode 212 rectifies the signal to produce a square wave 306. Waveform 308 represents the signal across the capacitor 216. Due to the low pass filter produced by the resistor 214 and the capacitor 216, the high frequency content of the square is removed and waveform 308 is smoothed compared to the waveform 306. Waveform 310 represents the logic levels present at the output from the XOR gate 222. As shown in FIG. 2, the waveform 310 is provided to an input of the XOR gate 234 and is also provided to the low pass filter formed by the resistor 230 and the capacitor 232. The low pass filter introduces a time delay into the waveform 310 and provides a filtered waveform 312 to another input of the XOR gate 234. Due to the time delay introduced into the waveform 312, the output of the XOR gate 234 provides a logic "1" to represent the transitions of waveform 310 from a low to high level or from a high to low level. A waveform 314 represents the output of XOR gate 234. The waveform 314 is inverted by the XOR gate 242 as represented by a waveform 316 and is provided to the counter 236 to control incrementing of the counter.

As counter 236 increments, data is placed in a register and a pulse is output to represent attaining a particular count. For example, a waveform 318 represents a logic "1" provided from the "G" output of counter 236 to indicate that a count of $2^6=64$ has been achieved. The waveform 318 is also inverted by XOR gate 244 (connected as an inverter) to provide a counter clearing signal to the counter 236 as represented by a waveform 320. The waveform 318 also provides a clock signal to the flip-flop unit 246. To produce a positive pulse for the gate of triac 252, a waveform 322 represents a low to high level output transition of the flip-flop unit 246. The waveform 322 is provided to the resistor 248 and the AC coupling capacitor 250 for delivery to the gate of the triac 252.

A waveform 324 represents an exponentially decaying pulse that is provided to the gate of the triac 252. By receiving the waveform 324, the triac 252 is triggered to provide a corresponding positive half cycle from the power source voltage signal, represented by a waveform 326, to the primary side of the transformer 108. In this example, a positive half cycle is provided to the transformer 108 by the operations of the transformer driver 112, as represented by the waveforms 304-326. However, to reduce magnetic biasing of the transformer 108, half cycle pulses with negative polarity may also be provided to the transformer.

Figure 4:
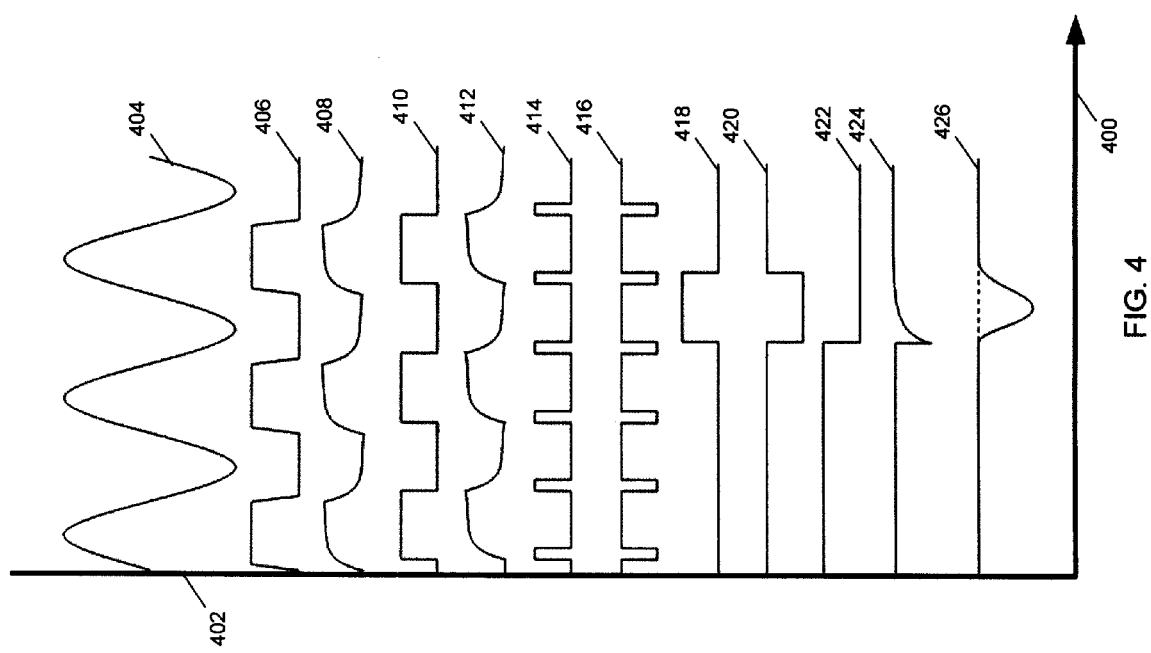
FIG. 4 is a diagram of waveforms for producing a negative half cycle pulse.

Referring to FIG. 4, a series of waveforms representative of operations performed by the transformer driver 112 for producing a negative half cycle pulse is shown. Equivalent to the waveforms 304-320, waveforms 404-420 represent operations of components included in the transformer driver 112. Also similar to the waveforms shown in FIG. 3, horizontal axis 400 and vertical axis 402 respectively represent time and offset voltage levels.

To initiate the production of a negative half cycle pulse for delivery to transformer 108, a high to low level transition is provided by the output of flip-flop unit 246 as represented by waveform 422. This voltage transition signal is provided to the resistor 248 and the AC coupling capacitor 250 that provides the gate of the triac 252 with a signal represented by a waveform 424. This exponentially increasing signal triggers the triac 252 and a negative half cycle pulse is produced, as represented by a waveform 426, and provided to the transformer 108.

Referring to FIG. 5, two waveforms 500, 502 respectively represent voltage signals present on the primary and secondary side of the transformer 108 during a reduced activity state (e.g., when the power supply is in standby). In particular, waveform 500 represents a voltage signal on the primary winding of the transformer. Due to the reduced activity state, the transformer driver 112 provides only a portion of the voltage signal from the power source 104. Half cycle pulses of alternating polarity are selected by the transformer driver 112 so that the primary side of the transformer 108 is not substantially magnetically biased. In this example, a time delay between the alternating half cycles is introduced by the counter 236 in the transformer driver 112. The time delay may be increased or decreased depending upon the application of the power supply 106.

The voltage level of the half cycle pulses typically depends upon the voltage signal provided by the power source 104. For example, for a 120 volts AC power source signal, the voltage level of each half cycle pulse is approximately +170 volts root mean square (RMS) for positive half cycles and −170 volts RMS for negative half cycles.

The waveform 502 represents the processed (e.g., rectified, filtered) voltage signal present on the secondary side of the transformer 112 when the waveform 500 is present on the primary side. The waveform 502 is a sawtooth voltage signal that may provide a positive voltage for the time periods between the half cycle pulses. To provide power to the standby circuit 110 during the reduced activity state, the voltage signal, for example, may have peak values of approximately 16 volts and minimum values of 6 volts. While voltage levels in this range may be large enough to power the standby circuit, other voltage ranges may also be provided dependent upon the transformer 108 and the processing (e.g., rectification, filtering).

A pair of waveforms 504 and 506 that represent voltage signals as the power supply 106 transitions from a standby state (in which power is only provided to the standby circuit) to an active state (in which power is provided to the load and the standby circuit). The waveform 504 represents the voltage signal present on the primary side of the transformer 108 and the waveform 506 represents the processed (e.g., rectified, filtered) signal from secondary side of the secondary side of the transformer 108. During the time period between T0 and T1, power supply 106 is operating in standby and the transformer driver 112 provides alternating half cycle pulses 508 and 510 to the primary winding of the transformer. Similar to the waveform 500, the half cycle pulses alternate in polarity and provide power to the standby circuit 110. At T1, a signal (e.g., button being pushed, remote control signal, etc.) is provided to the standby circuit 110 and the power supply 106 transitions to an active state in which power is provided to the load 102 and the standby circuit 110. While in this state, the triac 252 is continuously on by a signal from the standby circuit 110 (via the opto-coupler 258). Accordingly, the voltage signal provided by the power supply 104 is provided to the primary side of the transformer 108. In this example, a 120 volt AC signal is provided to the transformer 108 from time T1 onward.

The waveform 506 includes a sawtooth portion from T0 to T1 that is similar to the sawtooth waveform shown in waveform 502. The voltage level of the waveform 506 ranges between a peak value of approximately 16 volts to a minimum value of approximately 6 volts for providing power to the standby circuit 110 during the reduced activity state. From T1 onward, the voltage signal remains substantially constant at 16 volts for providing power to the load 102 and the standby circuit 110.

In the previous examples, the transformer driver 112 provided a series of half cycle pulses while in a reduced activity state. In particular, the series included half cycle pulses that alternated in polarity (e.g., positive pulse, negative pulse, positive pulse, etc.). However, other pulse arrangements, patterns and combinations may also be implemented. For example, rather than alternating polarity on a pulse by pulse basis, polarity may be alternated for each pair of pulses (e.g., positive pulse, positive pulse, negative pulse, negative pulse, etc.) or another similar pattern.

A number of embodiments of the invention have been described. Nevertheless, it will be understood that various modifications may be made without departing from the spirit and scope of the invention. For example, any voltage level or range of voltage levels may be provided by the power supply while in a reduce activity state (e.g., a standby state) or in a active state. Various time delays may be incorporated into the series of pulses provided to the transformer 108. For example, time delays larger or smaller than the period of the power source 104 voltage signal may be implemented. Accordingly, other embodiments are within the scope of the following claims.

What is claimed is:

1. A method comprising: providing a first input power signal to a transformer for supplying output power during a reduced activity state, in which the first input power signal comprises a series of pulses separated in time that comprises a positive pulse and a negative pulse, and in which the first signal is a segmented version of a second input power signal provided to the transformer during an active state.

2. The method of claim 1 in which the width of the positive and negative pulses is adjustable.

3. The method of claim 1 in which the series of pulses comprises positive pulses alternating with negative pulses.

4. The method of claim 1 in which the series of pulses comprises pairs of positive pulses alternating with pairs of negative pulses.

5. The method of claim 1 in which a predefined time delay is introduced between the positive pulse and the negative pulse.

6. The method of claim 1 in which a trigger initiates a transition from the inactive state to the active state.

7. The method of claim 1 in which a trigger initiates a transition from the active state to the inactive state.

8. The method of claim 1 in which the second input power signal comprises an alternating current (AC) voltage signal.

9. The method of claim 1 in which the series of pulses comprises a series of half cycle pulses.

10. The method of claim 1 in which the series of pulses comprises a series of half cycles of an AC voltage signal.

11. An apparatus comprising a driver circuit to provide a first input power signal to a transformer for supplying output power during a reduced activity state, in which the first input power signal comprises a series of pulses separated in time that comprises a positive pulse and a negative pulse, and in which the first signal is a segmented version of a second input signal provided to the transformer during an active state.

12. The apparatus of claim 11 in which the width of the positive and negative pulses is adjustable.

13. The apparatus of claim 11 in which the series of pulses comprises positive pulses alternating with negative pulses.

14. The apparatus of claim 11 in which the series of pulses comprises pairs of positive pulses alternating with pairs of negative pulses.

15. The apparatus of claim 11 in which a time delay separates the positive pulse and the negative pulse.

16. The apparatus of claim 15 in which a counter defines the time delay.

17. The apparatus of claim 15 in which a counter defines the time delay based, at least in part, upon counting an odd number of half cycles.

18. The apparatus of claim 11 in which the driver circuit receives a trigger signal to initiate a transition from the reduced-activity state to the active state.

19. The apparatus of claim 11 in which the second input signal comprises an AC voltage signal.

20. The apparatus of claim 11 in which the driver circuit comprises a bidirectional semiconductor device to provide the first signal.

21. The apparatus of claim 20 in which the bidirectional semiconductor device comprises a triac.

22. The apparatus of claim 11 in which the series of pulses comprises a series of half cycle pulses.

23. The apparatus of claim 11 in which the series of pulses comprises a series of half cycles of an AC voltage signal.

24. A system comprising a transformer to provide power to a load; and a driver circuit to provide a first input power signal to the transformer for supplying output power during a reduced activity state, in which the first input power signal comprises a series of pulses separated in time that comprises a positive pulse and a negative pulse, and in which the first signal is a segmented version of a second input power signal provided to the transformer during an active state.

25. The system of claim 24 further comprising a standby circuit to initiate a transition from the reduced-activity state to the active state.

26. The system of claim 24 in which the second input power signal comprises an AC voltage signal.

27. The system of claim 25 in which a trigger signal received by the standby circuit initiates the transition from the reduced-activity state to the active state.

28. The system of claim 24 in which the transformer provides power to the load during the active state.

29. The system of claim 24 in which the positive pulse is provided prior to the negative pulse.

30. The system of claim 24 in which the series of pulses comprises positive pulses alternating with negative pulses.

31. The system of claim 24 in which the series of pulses comprises pairs of positive pulses alternating with pairs of negative pulses.

* * * * *